(12) United States Patent
Forrest et al.

(10) Patent No.: US 6,330,378 B1
(45) Date of Patent: Dec. 11, 2001

(54) PHOTONIC INTEGRATED DETECTOR HAVING A PLURALITY OF ASYMMETRIC WAVEGUIDES

(75) Inventors: Stephen R. Forrest; Milind R. Gokhale, both of Princeton; Pavel V. Studenkov, Monmouth Junction, all of NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/717,851

(22) Filed: Nov. 21, 2000

Related U.S. Application Data

(60) Provisional application No. 60/203,846, filed on May 12, 2000.

(51) Int. Cl.[7] .............................. G02B 6/12; G02B 6/26; G02B 6/10
(52) U.S. Cl. ................................ 385/14; 385/28; 385/29; 385/30; 385/37; 385/42; 385/50; 385/43; 385/131; 372/50
(58) Field of Search ................................. 385/14, 28–29, 385/30, 31, 32, 37, 40–43, 50, 51, 130–132; 372/20, 45–50, 96, 97, 102

(56) References Cited

U.S. PATENT DOCUMENTS

| | | |
|---|---|---|
| 5,039,189 | 8/1991 | Lytel et al ................................. 385/2 |
| 5,140,149 | 8/1992 | Sakata et al. ......................... 250/211 |
| 5,208,878 | 5/1993 | Thulke .................................. 385/14 |
| 5,325,379 | 6/1994 | Amann .................................. 372/20 |
| 5,355,386 | 10/1994 | Rothman et al. ..................... 372/50 |
| 5,499,259 | 3/1996 | Makita .................................. 372/45 |
| 5,509,094 | * 4/1996 | Minami et al. ...................... 385/29 |
| 5,511,084 | 4/1996 | Amann .................................. 372/20 |
| 5,568,311 | 10/1996 | Matsumoto ......................... 359/344 |
| 5,623,363 | 4/1997 | Liou ..................................... 359/344 |
| 5,663,824 | 9/1997 | Koch et al. .......................... 359/184 |
| 5,852,687 | 12/1998 | Wickham .............................. 385/14 |

(List continued on next page.)

FOREIGN PATENT DOCUMENTS

99/67665   12/1999   (EP) .

OTHER PUBLICATIONS

Studenkov, P. V., et al., "Efficient Coupling in Integrated Twin–Waveguide Lasers Using Waveguide Tapers", *IEEE Photonics Technology Letters*, vol. 11, No. 9, pp. 1096–1098, (1999).

Studenkov, P. V., et al., "Asymmetric Twin–Waveguide 1.55–$\mu$m Wavelength Laser with a Distributed Bragg Reflector", *IEEE Photonics Technology Letters*, vol. 12, No. 5, pp. 468–470, (2000).

(List continued on next page.)

*Primary Examiner*—Hemang Sanghavi
(74) *Attorney, Agent, or Firm*—Woodcock Washburn Kurtz Mackiewicz & Norris LLP

(57) ABSTRACT

A photonic integrated circuit (PIC) device comprising two or more vertically stacked asymmetric waveguides is provided. A photo-detector PIC device comprises a coupling waveguide for providing low-coupling loss with an external optical fiber and for guiding primarily a first mode of light, a second waveguide vertically coupled to the first waveguide for guiding primarily a second mode of light having an effective index of refraction different from the first mode, and a photo-detector vertically coupled to the second waveguide. Light received at the coupling waveguide is moved into the second waveguide via a lateral taper in the second waveguide. The photo-detector PIC device may further comprise a third waveguide having an optical amplifier therein and positioned between the coupling waveguide and the second waveguide.

40 Claims, 14 Drawing Sheets

U.S. PATENT DOCUMENTS

| | | | |
|---|---|---|---|
| 5,859,866 | | 1/1999 | Forrest et al. .......................... 372/50 |
| 5,985,685 | * | 11/1999 | Lealman et al. ....................... 385/28 |
| 6,198,863 | * | 3/2001 | Lealman et al. ....................... 385/37 |
| 6,240,233 | * | 5/2001 | Weinert et al. ...................... 385/131 |

OTHER PUBLICATIONS

Studenkov, P. V., et al., "Monolithic Integration of a Quantum–Well Laser and an Optical Amplifier Using an Asymmetric Twin–Waveguide Structure", *IEEE Photonics Technology Letters*, vol. 10, No. 8, pp. 1088–1090, (1998).

* cited by examiner

US 6,330,378 B1

PHOTONIC INTEGRATED DETECTOR HAVING A PLURALITY OF ASYMMETRIC WAVEGUIDES

RELATED APPLICATIONS

This application is related by subject matter to U.S. Provisional Patent Application Serial No. 60/203,846, filed May 12, 2000, entitled "Twin Waveguide Based Design for Photonic Integrated Circuits" the contents of which are hereby incorporated by reference in their entirety.

FIELD OF THE INVENTION

The present invention relates generally to the field of optical communications devices, and more particularly to photonic integrated circuits.

BACKGROUND OF THE INVENTION

Photonic integrated circuits (PIC) provide an integrated technology platform increasingly used to form complex optical circuits. PIC technology allows many optical devices, both active and passive, to be integrated on a single substrate. For example, PICs may comprise integrated lasers, integrated receivers, waveguides, detectors, semiconductor optical amplifiers (SOA), and other active and passive semiconductor optical devices. Monolithic integration of active and passive devices in PICs provides an effective integrated technology platform for use in optical communications.

A particularly versatile PIC platform technology is the integrated twin waveguide (TG) structure. Twin waveguides combine active and passive waveguides in a vertical directional coupler geometry using evanescent field coupling. The TG structure requires only a single epitaxial growth step to produce a structure on which active and passive devices are layered and fabricated. That is, TG provides a platform technology by which a variety of PICs, each with different layouts and components, can be fabricated from the same base wafer. Integrated components are defined by post-growth patterning, eliminating the need for epitaxial regrowth. Additionally, the active and passive components in a TG-based PIC can be separately optimized with post-growth processing steps used to determine the location and type of devices on the PIC.

The conventional TG structure, however, suffers from the disadvantage that waveguide coupling is strongly dependent on device length, due to interaction between optical modes. For PIC devices such as lasers, the interaction between optical modes results in an inability to control the lasing threshold current and coupling to passive waveguides as a consequence of the sensitivity to variations in the device structure itself. The sensitivity variations arise from the interaction between the even and the odd modes of propagation in the conventional TG structure. This interaction leads to constructive and destructive interference in the laser cavity, which affects the threshold current, modal gain, coupling efficiency and output coupling parameters of the device. The conventional TG structure suffers from unstable sensitivity in performance characteristics due to device length, even/odd mode interaction, and variations in the layered structure.

A modified TG structure, referred to as an asymmetric twin waveguide (ATG), disclosed in US Patent Application Ser. No. 09/337,785, filed on Jun. 22, 1999, entitled "Twin Waveguide Based Design for Photonic Integrated Circuits," the contents of which are hereby incorporated by reference in their entirety, addresses some of the performance problems of the conventional TG structure. The ATG structure significantly reduces modal interference by confining different modes of light to propagation in different waveguides. This is accomplished by designing each of the single mode waveguides that are comprised in the twin waveguide such that the mode of light that propagates in each of the two waveguides has a different effective index of refraction. The asymmetric waveguides may be laterally tapered to reduce coupling losses by resonant or adiabatic coupling of the optical energy between the first and second waveguide. The asymmetric waveguide design significantly reduces the interaction between optical modes and therefore represents a great improvement over traditional TG devices.

The ATG promises to be a versatile platform technology. Indeed, the inventors in an article entitled "Efficient Coupling in Integrated Twin-Waveguide Lasers Using Waveguide Tapers" published in volume 11, number 9, of the IEEE Photonic Technology Letters (September 1999), the contents of which are hereby incorporated by reference, suggest a design for integrating lasers using waveguides. Further, in an article entitled "Asymmetric Twin-Waveguide 1.55-$\mu$m Wavelength Laser with a Distributed Bragg Reflector," published in volume 12, number 5, IEEE Photonic Tech. Letters (May 2000), the contents of which are hereby incorporated by reference, the inventors have disclosed designs for a laser device based upon the asymmetric twin waveguide design.

While these developments show promise for the ATG design, the need exists to develop the complex circuits often touted but, as of yet, not realized from PIC technology. Specifically, there is a need for improved PIC platforms that combine multiple optical devices, both active and passive, on a single substrate. More particularly, as described in an article by Nisa Hhan and Jim Rue entitled "Manufacturers Focus on the 40 Gbit/s Challenge," published in the June/July 2000 edition of FiberSystems International, the contents of which hereby incorporated, there is a need in the art for improved integrated photonic devices such as high speed detectors. Furthermore, there is a need to integrate photo-optical amplifiers with detectors so as to improve detector responsivity.

SUMMARY OF THE INVENTION

Briefly, the present invention meets these and other needs in the art.

According to a first aspect of the invention, an asymmetric twin waveguide photo-detector device is provided. The photo-detector device comprises a coupling waveguide for providing low-coupling loss with an external optical fiber and for guiding primarily a first mode of light, a second waveguide vertically coupled to the first waveguide for guiding primarily a second mode of light having an effective index of refraction different from the first mode, and a photo-detector vertically coupled to the second waveguide. Light received at the coupling waveguide is moved into the second waveguide via a lateral taper in the second waveguide. The photo-detector device adjacent to the second waveguide receives the light propagating in the second waveguide via evanescent coupling.

According to another aspect of the invention there is provided a PIC device comprising more than two vertically stacked asymmetric waveguides. A PIC device with more than two asymmetric waveguides allows for the integration of varied types of devices in a single wafer. For example, while one waveguide may be employed for coupling with another device, a second waveguide may be used to amplify signals, and still another waveguide may be used to transport the amplified signal to another device. Expanding the number of asymmetric waveguides beyond two greatly enhances the number and types of devices that can be devised.

According to another aspect of the invention, an embodiment of a PIC device comprising more than two vertically integrated asymmetric waveguides is disclosed. Specifically, there is provided an asymmetric waveguide based photo-detector device having an optical amplifier integrated therein. The photo-detector device comprises a coupling waveguide designed to provide low-coupling loss with an external optical fiber and which guides primarily a first mode of light, a second waveguide for guiding and amplifying primarily a second mode of light having a higher effective index of refraction than the first mode of light, a third waveguide for guiding primarily a third mode of light having a higher effective index of refraction than the second mode of light, and a photo-detector which is evanescently coupled to the third waveguide. In the amplifier photo-detection PIC, light enters the coupling waveguide and is coupled, via the lateral taper, to the second waveguide comprising an optical amplifier. The light is amplified across the length of the second waveguide and coupled into the third waveguide via a second lateral taper. While propagating in the third waveguide the light is absorbed by the photo-detector that is evanescently coupled to the third waveguide. The amplifier photo-detector device represents just one of the many types of devices that may be devised using more than two vertically stacked asymmetric waveguides.

Photo-detectors and amplifier photo-detectors in accordance with the invention offer substantially improved receiver responsivity. Indeed, detectors in accordance with the invention are operable to receive optical signals transmitted at rates at least up to 40 GHz. Furthermore, the detectors are tolerant of variances resulting during manufacturing. Thus, photo-detectors and amplifier photo-detectors in accordance with the invention are particularly well suited for use in commercial optical communication devices.

Additional aspects of the invention are described in detail below.

BRIEF DESCRIPTION OF THE DRAWINGS

Other features of the invention will be further apparent from the following detailed description of presently preferred exemplary embodiments of the invention taken in conjunction with the accompanying drawings, of which.

DETAILED DESCRIPTION OF THE INVENTION

A system and method with the above-mentioned beneficial features in accordance with a presently preferred exemplary embodiment of the invention will be described below with reference to FIGS. 1–13. It will be appreciated by those of ordinary skill in the art that the description given herein with respect to those figures is for illustrative purposes only and is not intended in any way to limit the scope of the invention. All questions regarding the scope of the invention may be resolved by referring to the appended claims.

Generally, the present application is directed toward monolithically integrated asymmetric waveguide structures. An asymmetric twin waveguide (ATG) design has been disclosed in co-pending U.S. patent application Ser. No. 09/337,785, filed on Jun. 22, 1999, entitled "Twin Waveguide Based Design for Photonic Integrated Circuits," the contents of which are hereby incorporated by reference in their entirety. Generally, the ATG design employs two waveguides wherein each waveguide is designed to guide primarily one mode of light with each mode having a different effective index of refraction. A lateral taper in one of the waveguides induces coupling of light between the waveguides. The lateral taper operates to change the effective refractive index of a mode of light traveling in the first waveguide to a second mode that propagates primarily in the second waveguide. This transition occurs across the length of the taper. Thus, a mode of light having a first index of refraction may begin to propagate in second waveguide at the beginning of a taper, and be transitioned to a second mode of light having a higher effective index of refraction by the end of the taper region which causes the mode to be essentially locked into propagating in the second waveguide.

The present application is directed toward PIC devices having a plurality of vertically integrated waveguides with lateral tapers formed therein. According to a first aspect of the invention, a photo-detection PIC is provided having a photo-detector evanescently coupled to one of a plurality of waveguides. Light received at a first waveguide is coupled into to a second waveguide via a lateral taper in the second waveguide. A photo-detector device on top of the second waveguide receives the light propagating in the second waveguide through evanescent coupling. Thus, light received at the first waveguide is detected by a detector evanescently coupled to the second waveguide.

Figure 1A:
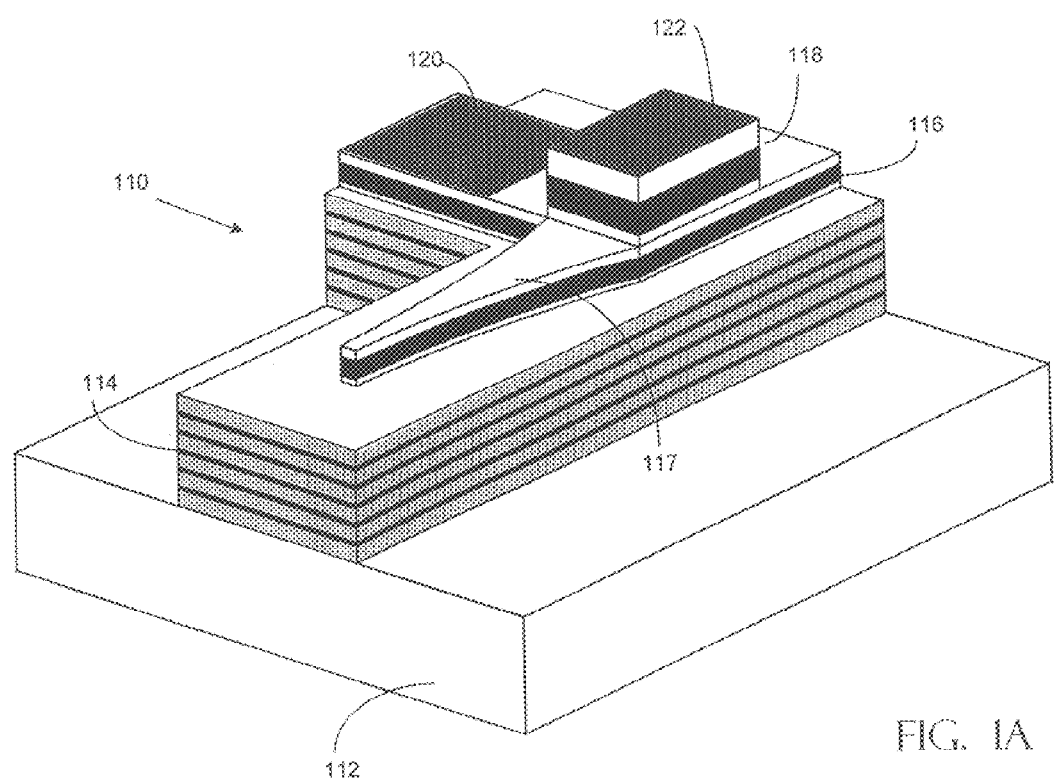
FIG. 1A is a perspective view of a photo-detection PIC in accordance with an aspect of the invention.

FIG. 1A provides a perspective view of an exemplary photo-detector device in accordance with an aspect of the present invention. As shown, the monolithically integrated photo-detection PIC 110 is situated on substrate 112 and comprises a first waveguide 114, a second waveguide 116, and a detector 118. Photo-detection PIC 110 further comprises n contact 120 and p contact 122. Waveguide 114 is designed to provide a low-coupling loss from a lensed or cleaved single mode optical fiber. In an exemplary embodiment the coupling loss between waveguide 114 and a lensed or cleaved optical fiber is less than 2 dB. Further, waveguide 114 has a far-field pattern angle of between about 13 degrees and 18 degrees in both a vertical and horizontal direction. In the exemplary embodiment, the materials and relative thickness of those materials comprising waveguide 114 have been selected such that a mode of light propagating primarily in waveguide 114 has an effective index of refraction of between about 3.173 and 3.177.

Waveguide 116 is situated on top of and is integrally formed with waveguide 114. Waveguide 116 has been designed to guide primarily one mode of light wherein the mode of light has a higher effective index of refraction than the mode of light propagating in waveguide 114. In an exemplary embodiment, the effective index of refraction of the mode of light propagating in waveguide 116 is between about 3.2 and 3.22. Waveguide 116 has a lateral tapered area 117 to improve the coupling of light from waveguide 114 to waveguide 116. In an exemplary embodiment the coupling loss between waveguide 114 and waveguide 116 is less than 1 dB.

Detector 118 is situated on top of and integrally formed with waveguide 116. In an exemplary embodiment, detector 118 is a PIN type detector comprising a p+ cladding layer, an n+ matching layer, and an InGaAs absorption layer. In an exemplary embodiment, the absorption coefficient between waveguide 116 and detector 118 is such that greater than 80% of the light is absorbed in the span of about 30 $\mu$m of the photo-detector. It should be noted that while in the exemplary embodiment detector 118 is separate from waveguide 116, in alternative embodiments, detector 118 might be integrated in waveguide 116.

Light enters photo-detection PIC 110 through waveguide 114, which may be coupled to another device such as, for example an optical fiber. At least a first mode of light propagates through waveguide 114 and upon reaching tapered portion 117 of waveguide 116, begins to propagate in waveguide 116. The effective index of refraction of the first mode increases across the length of taper region 117. As a consequence, upon reaching the wide end of taper region 117, the light propagating in the taper is transitioned into a second mode of light which is primarily confined to waveguide 116. The second mode of light propagating primarily in waveguide 116 is evanescently coupled to detector 118. Over the length of detector 118, sufficient quantities of the evanescent fields can be absorbed to effectively identify the presence of light in waveguide 116.

Figure 1B:
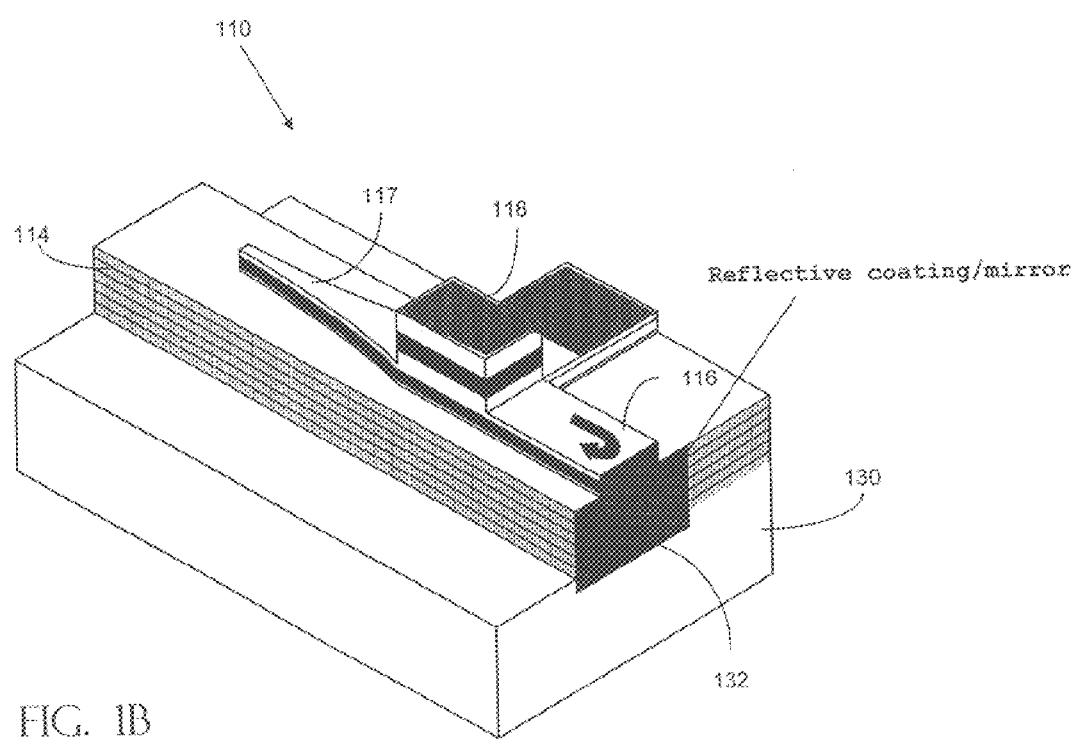
FIG. 1B is a second perspective view of a photo-detection PIC in accordance with an aspect of the invention.

FIG. 1B provides a perspective view of an embodiment of photo-detector device 110. As shown, photo-detector device 110 may further comprise reflector 130. Reflector 130 is positioned adjacent waveguides 114 and 116 and operates to reflect light that is incident thereon. Accordingly, light propagating in waveguide 114 that is not absorbed in detector 118 upon a first pass, is reflected back in waveguide 114 and can be absorbed during a second pass under detector 118. By providing for a second pass of light under detector 118, reflector 130 potentially increases the responsivity of device 110. Furthermore, because reflector 130 provides for a double-pass of light below detector 118, detector 118 may be physically smaller and still provide the same level of responsivity. Reflector 130 may be comprised of a reflective metal such as, for example, gold or silver. Reflector 130 might also be comprised of a dielectric stack.

An asymmetric waveguide detector in accordance with the invention is characterized by minimum coupling loss and low polarization sensitivity. Indeed, the responsivity of the detector is largely independent of polarization. These characteristics of the invention are, in part, a function of the physical composition of the waveguides.

Figure 2:
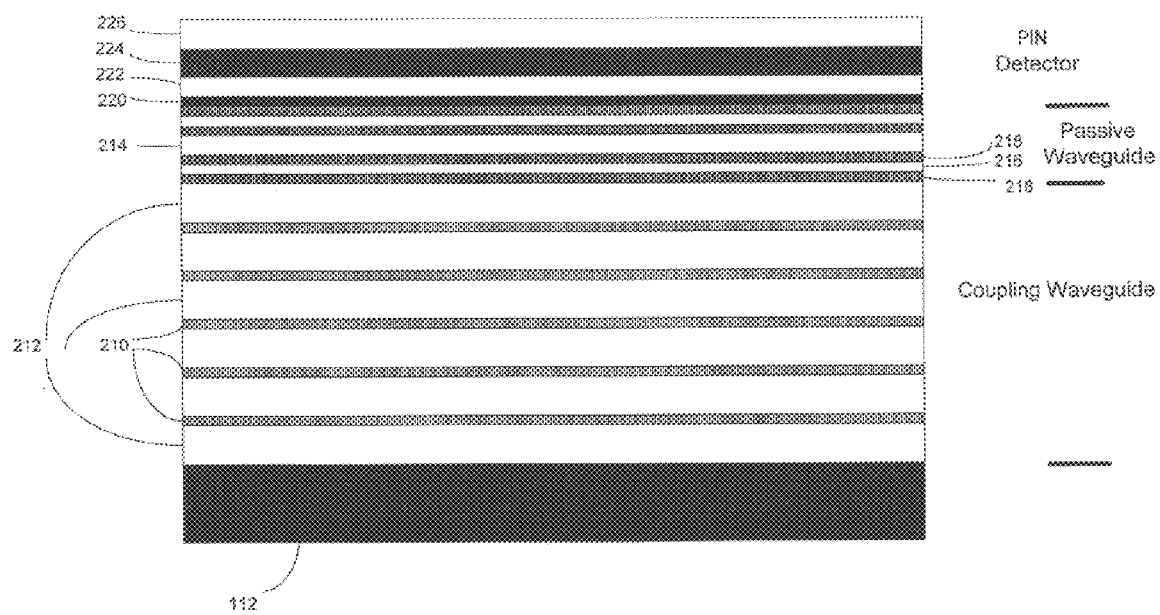
FIG. 2 is a sectional view of a photo-detection PIC in accordance with an aspect of the invention.

FIG. 2 provides an exemplary sectional view of photo-detection PIC 110. As shown, PIC 110 is grown on a semi-insulating or doped InP substrate 112. Coupling waveguide 114 comprises five 500 Å thick InGaAsP (bandgap $E_g$=1.03 eV) layers 210 interspersed between six 0.55 $\mu$m thick InP layers 212. The composition of waveguide 114 has been designed such that a mode of light propagating primarily in waveguide 114 has an effective index of refraction of between about 3.173 and 3.177.

Waveguide 116 comprises a central InGaAsP layer 214 having a thickness of between 0.25 and 0.29 $\mu$m. Waveguide 116 further comprises two 300 Å InGaAsP layers 216, one on either side of central layer 214, each of which is positioned between two 900 Å thick InP layers 218. Waveguide 116 has been designed such that a mode of light propagating primarily in waveguide 116 has an effective index of refraction of between about 3.2 and 3.22. In accordance with the asymmetric design of the PIC 110, layers 214, 216, and 218 result in a mode of light that propagates primarily in waveguide 116 having a higher effective index of refraction than that of the mode propagating primarily in waveguide 114.

A 0.15 $\mu$m thick n-doped layer 220 is positioned between waveguide 116 and PIN detector 118 to increase evanescent coupling and absorption. PIN detector 118 comprises n-doped layer 222 which is between about 0.1 and 0.3 $\mu$m thick, an $In_{0.53}Ga_{0.47}As$ absorption layer 224 which is between about 0.5 and 0.6 $\mu$m thick, and a p-doped InP layer 226 which is about 0.6 $\mu$m thick. One skilled in the art will recognize that in an alternative embodiment, the polarity of the doping layers in the PIN structure may be reversed to form a p+ bottom layer, undoped InGaAs layer and a top n+ layer.

The low coupling loss and low polarization sensitivity associated with the present invention is also a function of lateral taper 117. In addition, a lateral taper in accordance with the invention is tolerant of variations in width associated with fabrication imperfections. A lateral taper with a slow or adiabatic change in width over a relatively long length, such as, for example 1 mm, may exhibit such characteristics. The inventors, however, have created an asymmetric waveguide design, which provides the low coupling loss, low polarization sensitivity, and tolerance of fabrication imperfections, using a lateral taper of significantly shorter proportions, i.e. between about 250 and 400 $\mu$m.

Figure 3:
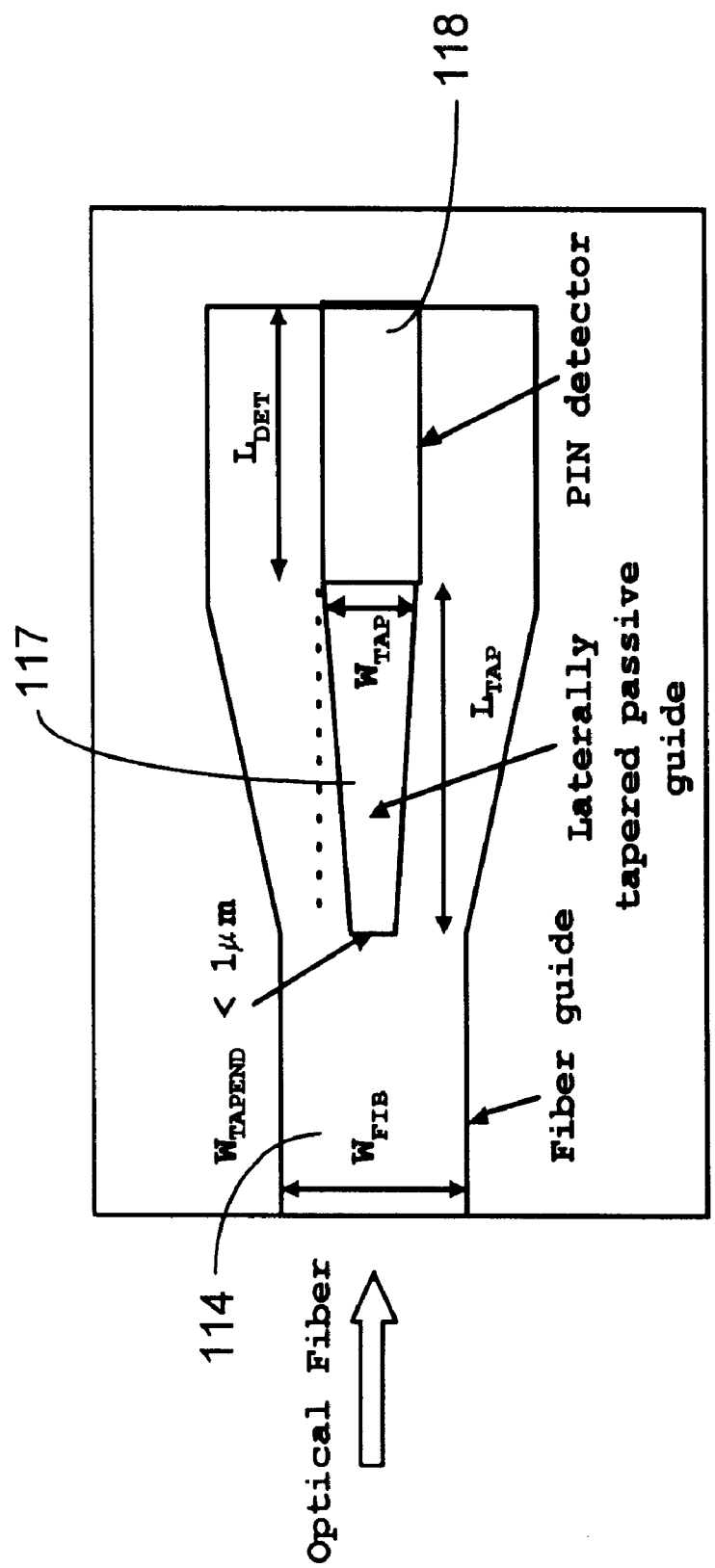
FIG. 3 is a top plan view of a photo-detection PIC in accordance with an aspect of the invention.

FIG. 3 provides a top view of photo-detection PIC 110. In the exemplary embodiment, the width of the coupling guide 114, referred to herein as $W_{FIB}$, is 5 $\mu$m. The width of the tapered end of waveguide 116, referred to herein as $W_{TAPEND}$, is 1 $\mu$m. The width of the taper at one point, which in the exemplary embodiment is the taper's widest point, referred to herein as $W_{TAP}$, is between about 1.8 and 2.2 $\mu$m. The length of the taper from its end to the point corresponding to $W_{TAP}$, which is referred to herein as $L_{TAP}$, is between about 250 and 400 μm. The above described values for $W_{TAPEND}$, $W_{TAP}$, and $L_{TAP}$ result in a lateral taper angle, θ, of between about 0.05 and 0.09 degrees. The length of detector 118, which is referred herein as $L_{DET}$, is between about 20 and 50 μm.

Figure 4:
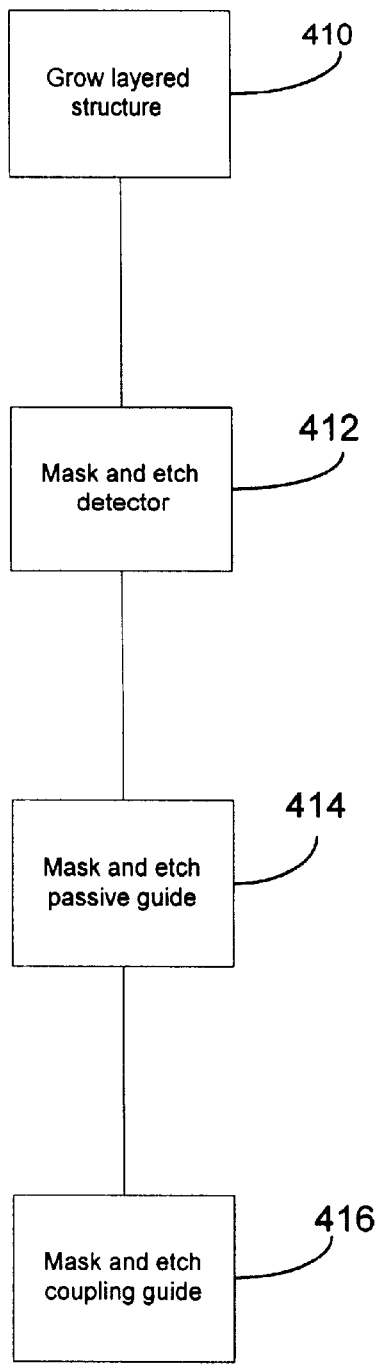
FIG. 4 is a flowchart of a process for manufacturing a photo-detection PIC in accordance with an aspect of the invention.

Photo-detection PIN 110 is manufactured through a series of masking and etching steps. FIG. 4 provides a flowchart of a process for manufacturing a photo-detection PIN in accordance with an aspect of the invention. As shown, at step 410, a monolithic structure comprising layers as described above with reference to FIG. 2 is grown by molecular beam epitaxy (MBE) or metal-organic chemical vapor deposition (MOCVD), for example, in a single epitaxial step on InP substrate 112. At step 412, the outline of detector 122 is defined via masking and the surrounding layers etched away to the top of waveguide 116. At step 414, waveguide 116 with lateral taper 117, is defined via masking and the surrounding areas etched away to the top of waveguide 114. At step 416, an outline of waveguide 114 is defined via masking and the surrounding areas etched away to the top of substrate 112.

As has been previously noted, the efficiency of transfer of light, i.e. the coupling loss and polarization sensitivity, between waveguide 112 and waveguide 114 is dependent on the asymmetry between the two waveguides and the dimensions of taper 117. With respect to waveguide asymmetry, the inventors have used the same InGaAsP growth material, assumed to be deposited at the same growth rate, in both waveguides. The degree of asymmetry between guides is determined by the growth times for the various InGaAsP layers that make up the two guides and not by differences in the composition of the material layers. Furthermore, any drift in the InGaAsP growth rate, which may be ±10%, affects both waveguides.

Figure 5:
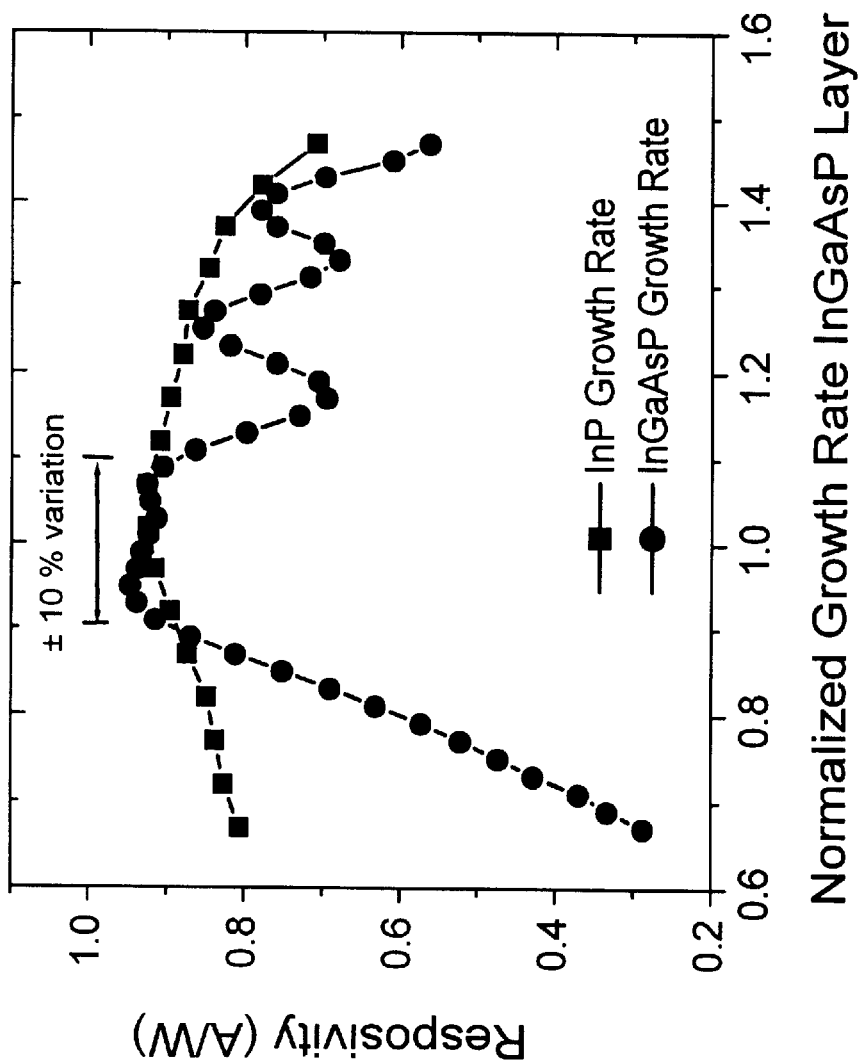
FIG. 5 is a graph of the responsivity of a photo-detection PIC in accordance with the invention as a function of the growth rate of its composite layers.

FIG. 5 provides a graph of the responsivity (in amperes per watt) of a detector in accordance with the invention as a function of the growth rate of the InGaAsP layers that comprise the detector. The growth rate variation is normalized with respect to a particular layer design that yields high responsivity in this detector structure. As shown, where the growth rate of the InGaAsP layers is between about 0.9 and 1.1, or a ±10% variation, the responsivity of the detector is largely unaffected by the variation and is above 0.8 A/W. Thus, the detector performance (responsivity) is tolerant to growth rate variations that may occur during deposition of the InP and/or InGaAsP layers of the structure.

With respect to the design of lateral taper 117, the inventors have selected design parameters to minimize the coupling losses between the waveguide 114 and waveguide 116 and thereby increase the responsivity of the detector. Also, lateral taper 117 is designed to provide performance that is largely independent of variations resulting from fabrication imperfections.

Figure 6:
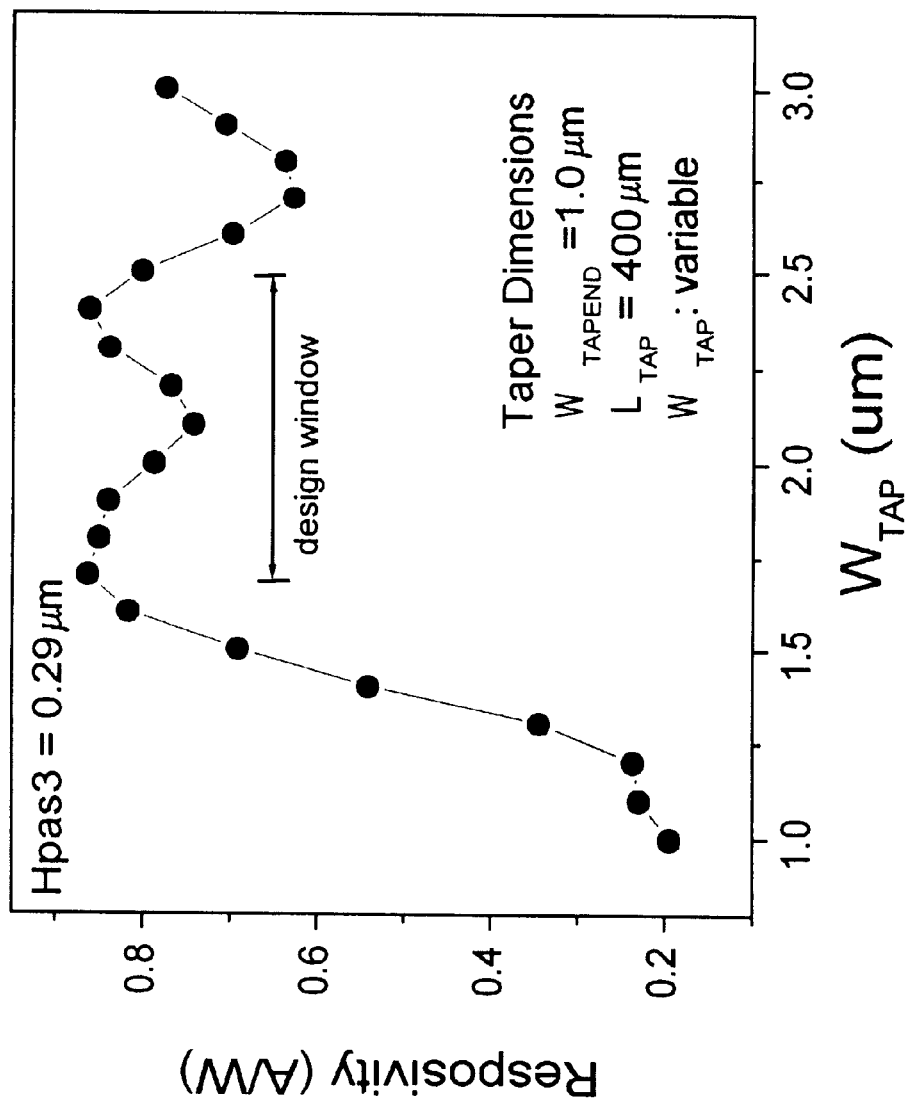
FIG. 6 is a graph of the responsivity of a photo-detection PIC in accordance with the invention as a function of the width of the lateral taper formed therein.

FIG. 6 provides a graph of the responsivity of a detector in accordance with an aspect of the invention as a function of the width of the lateral taper. As shown in FIG. 6, for a taper with a width at the tapered end ($W_{TAPEND}$) of 1.0 μm, and a taper length ($L_{TAP}$) equal to 400 μm, the highest responsivity from detector 118 is obtained when the width of the taper at its widest point ($W_{TAP}$) is between about 1.8 and 2.2 μm.

FIGS. 5 and 6 confirm that a photo-detection device having the above-described measurements is highly responsive. Indeed, a photo-detection device having the above-described properties is suitable for use at speeds of at least up to 40 GHz. The inventors have empirically concluded that for the exemplary embodiment of the photo-detection device the polarization sensitivity is less than 0.5 dB. Furthermore, because the photo-detector is tolerant of variances resulting from manufacturing imperfections in addition to being operable at very high speeds, it is particularly well suited for use in commercial optical communications equipment.

According to another aspect of the invention there is provided a PIC device comprising more than two vertically coupled asymmetric waveguides. A PIC device with more than two vertically coupled asymmetric waveguides allows for the integration of numerous and varied types of devices in a single wafer. For example, while one waveguide may be employed for coupling with another device, a second waveguide may be used to amplify signals, and still another waveguide may be used to transport the amplified signal to another device. Expanding the number of asymmetric waveguides beyond two greatly enhances the number and types of devices that can be devised in a single wafer.

Figure 7:
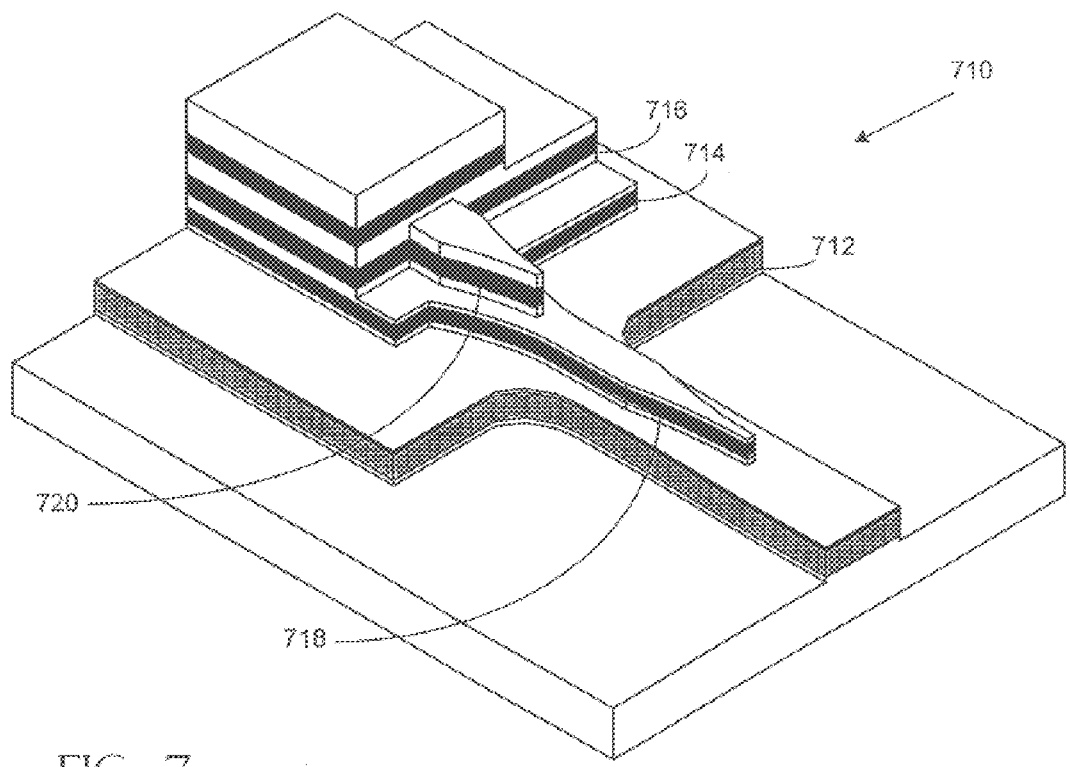
FIG. 7 is a perspective view of a PIC comprising more than two vertically integrated waveguides in accordance with the invention.

FIG. 7 provides a perspective view of an exemplary PIC device comprising more than two vertically coupled asymmetric waveguides. As shown, PIC 710 comprises first waveguide 712, second waveguide 714, and third waveguide 716. The materials and relative thickness of those materials that comprise waveguides 712, 714, and 716 are selected such that a different mode of light, each having a different effective index of refraction, propagates primarily in one of the waveguides. Lateral tapers are formed in the waveguides to control the movement of light between waveguides. For example, waveguide 714 has lateral taper 718 formed therein for coupling light between waveguide 712 and waveguide 714. Likewise, waveguide 716 has lateral taper 720 formed therein for moving light between waveguide 716 and waveguide 714.

Waveguides 712, 714, and 716 may be employed to provide active and passive devices on a single substrate. For example, the waveguides may be used to provide active devices such as, for example, semiconductor optical amplifiers, and lasers. Also, the waveguides may be employed to provide passive devices such as, for example, detectors, couplers, splitters, Mach Zehnder interferometers, grating sections, and arrayed waveguide (AWG) routers. Of course, waveguides 712, 714, and 716 may be used simply to transport light from one device to another.

Thus, according to an aspect of the invention, more than two vertically integrated waveguides are provided that have been designed such that a particular mode of light propagates primarily in each of the waveguides. Lateral tapers are formed in the waveguides to control the transfer of the modes of light between waveguides. Further, active and passive devices may be designed around the waveguides. It is, therefore, possible to combine active and passive devices on a single chip in numerous combinations to form varied types of complex PIC devices.

An amplifier photo-detection PIC represents an exemplary embodiment of a PIC device comprising more than two vertically coupled asymmetric waveguides. In the amplified photo-detection PIC, light enters a first waveguide and is coupled to a second waveguide comprising an optical amplifier. The amplifier may be a semiconductor optical amplifier (SOA) or traveling wave amplifier (TWA). After being amplified over the length of the second waveguide, the light is coupled into a third waveguide, and ultimately absorbed by a photo-detector which is evanescently coupled to the third waveguide.

Figure 8:
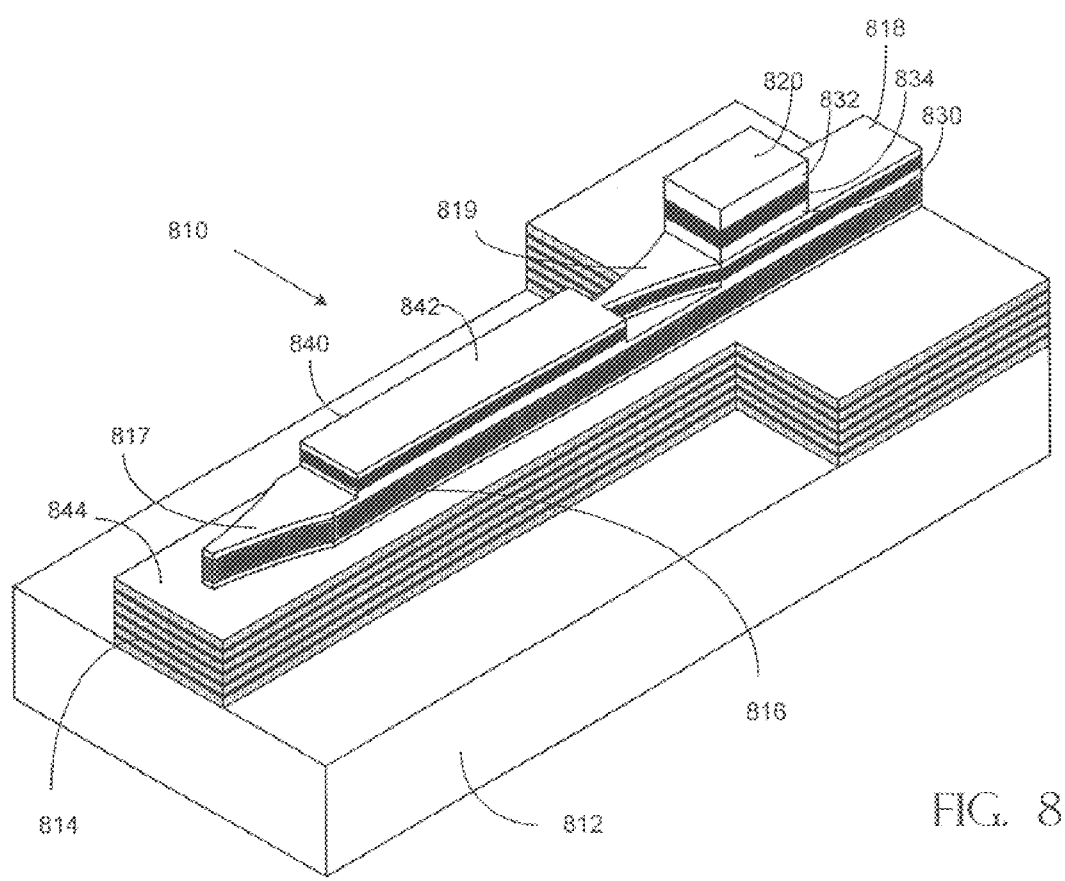
FIG. 8 is a perspective view of an asymmetric photo-detection PIC with optical amplifier in accordance with an aspect of the invention.

FIG. 8 provides a perspective view of an exemplary asymmetric photo-detection PIC having an optical amplifier in accordance with the invention. As shown, the monolithically integrated photo-detection PIC 810 is situated on substrate 812 and comprises coupling waveguide 814, amplifying waveguide 816, a third waveguide 818, and a detector 820. Waveguide 814 is about 5 µm wide and is designed to provide a low-coupling loss, for example, less than 2 dB, from a lensed or cleaved single mode optical fiber. Waveguide 814 has a far-field pattern angle of between about 13 degrees and 18 degrees in both a vertical and horizontal direction. Waveguide 814 is designed such that a first mode of light propagates primarily in waveguide 814. In an exemplary embodiment, the first mode of light has an effective index of refraction of about 3.2.

Amplifying waveguide 816 is situated on top of and is integrally formed with waveguide 814. Waveguide 816 has an optical amplifier formed therein that may contain, for example, multiple quantum wells (MQWs) or a bulk active region. Waveguide 816 is designed such that a second mode of light propagates primarily in the waveguide 816. In accordance with the asymmetric waveguide design, the second mode of light propagating in the second waveguide 816 has an effective index of refraction of about 3.32 which is greater than the effective index of refraction associated with the first mode of light propagating in waveguide 814. Waveguide 816 has a lateral tapered area 817 to improve the coupling of light from waveguide 814 to waveguide 816. In an exemplary embodiment, the coupling loss between waveguide 816 and waveguide 814 is less than 1 db.

Waveguide 818 is situated on top of and is integrally formed with waveguide 816. Waveguide 818 is designed such that a third mode of light propagates primarily in the waveguide. In accordance with the asymmetric waveguide design, the third mode of light propagating in waveguide 818 has an effective index of refraction of about 3.37 which is greater than the effective index of refraction associated with the second mode of light propagating in waveguide 816. Waveguide 818 also has a lateral tapered area 819 to improve the coupling of light from waveguide 816 to waveguide 818. In an exemplary embodiment, the coupling loss between waveguide 818 and waveguide 816 is less than 1 db. It should be noted that while in the exemplary embodiment tapers sections 819 and 817 do not overlap, in alternative embodiments, tapers 817 and 819 could overlap partially or even entirely, depending upon the application.

Detector 820 is situated on top of and integrally formed with waveguide 818. In an exemplary embodiment, detector 820 is between about 20 and 50 µm long and is a PIN type detector comprising p+ cladding layer 830, n+ matching layer 832, and an InGaAs absorption layer 834. The polarity of the doping layers in the PIN structure may be reversed from that shown. The absorption coefficient between waveguide 818 and detector 820 is greater than 80% in the span of 30 µm of photo-detector 820. It should be noted that while in the exemplary embodiment detector 820 is a component separate from waveguide 818, in alternative embodiments, detector 820 might be integrated in waveguide 818.

Waveguide 818 comprises an extension area 840 which extends in front of taper area 819. Top surface 842 of waveguide 818 provides a first contact area for activating the amplifier comprised in waveguide 816. In the exemplary embodiment, the contact is a p+ contact. The second contact for activating the amplifier of waveguide 816 is top surface 844 of waveguide 814. In the exemplary embodiment, the second contact is an n+ contact. Applying a voltage across the contacts activates the amplifier comprised in waveguide 816 which causes light propagating therein to be amplified.

Light enters photo-detection PIC 810 via waveguide 814, which may be coupled to another device such as, for example an optical fiber. At least a first mode of light propagates through waveguide 814 and upon reaching tapered portion 817 of waveguide 816, begins to propagate in waveguide 816. The effective index of refraction of the first mode increases across the length of taper region 817. As a consequence, upon reaching the wide end of taper region 817, the light propagating in the taper is transitioned into a second mode of light which is primarily confined to waveguide 816. While propagating in waveguide 816, the light experiences gain as a result of the optical amplifier therein. The second mode of light propagating primarily in waveguide 816, upon reaching tapered portion 819 of waveguide 818, begins to propagate in waveguide 818. The effective index of refraction of the second mode increases across the length of taper region 819. As a consequence, upon reaching the wide end of taper region 819, the light propagating in the taper is transitioned into a third mode of light which is primarily confined to waveguide 818. Waveguide 818 is evanescently coupled to detector 820. Sufficient quantities of the evanescent fields can be absorbed across a short distance, for example 20 to 100 µm, of detector 820 to effectively identify the presence of light in waveguide 818.

Figure 9:
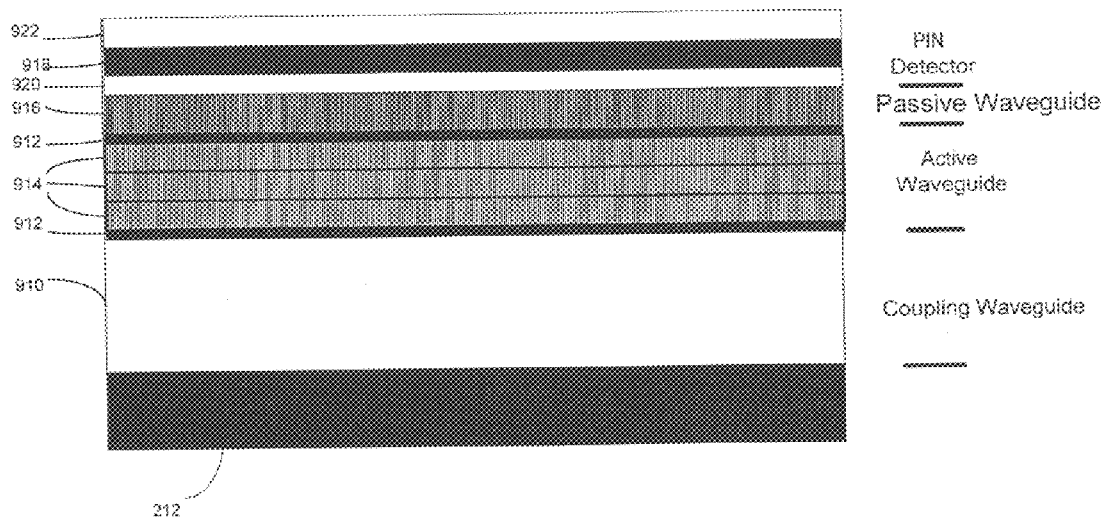
FIG. 9 is a sectional view of an amplifier photo-detection PIC in accordance with an aspect of the invention.

FIG. 9 provides a cross sectional view of an exemplary asymmetric photo-detector PIC having an optical amplifier in accordance with an aspect of the invention. As shown, PIC 810 is grown on a semi-insulating substrate 812, which in an exemplary embodiment is composed of InP. Coupling waveguide 814 comprises InGaAsP layer 910, which is about 3 µm thick. In an alternative embodiment, coupling waveguide 814 might comprise several thin InGaAsP layers having a higher index of refraction interspersed with InP layers to form a single-mode diluted waveguide. Referring to FIG. 9, waveguide 816 comprises three InGaAsP quantum wells 912 positioned between two confinement heterostructure layers 914 each of which is about 0.15 µm thick. The quantum wells are tensile and compressive strained to form a polarization insensitive optical amplifier. Waveguide 818 comprises InGaAsP layer 914 which is about 0.6 µm thick. Detector 818 comprises n-doped layer 916, InGaAs absorption layer 918, and p-doped InP layer 920. In alternative embodiment, the polarity of the doping layers in the PIN structure may be reversed to form a p+ bottom layer, an undoped InGaAs layer and a top n+ layer.

Figure 10:
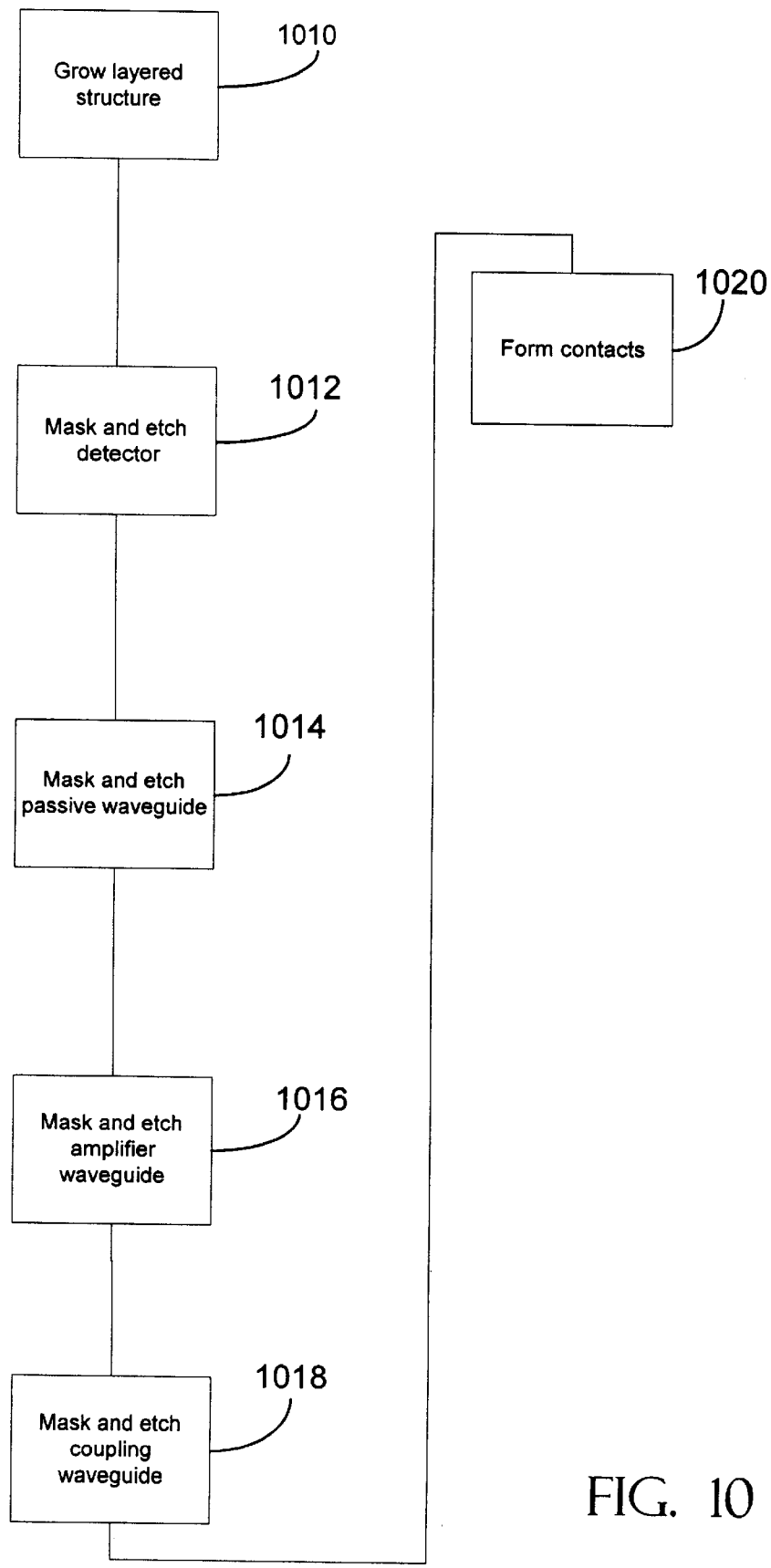
FIG. 10 is a flowchart of a process for manufacturing an amplifier photo-detection PIC in accordance with an aspect of the invention.

Asymmetric photo-detection PIC 810 is manufactured through a series of masking and etching steps. FIG. 10 provides a flowchart of a process for manufacturing a photo-detection PIN in accordance with an aspect of the invention. As shown, at step 1010, a monolithic structure comprising layers as described above with reference to FIG. 9 is grown by MBE or MOCVD, for example, in a single epitaxial step on InP substrate 112. At step 1012, the outline of detector 820 is defined via masking, and the surrounding layers etched away to the top of waveguide 818. At step 1014, waveguide 818, which has lateral taper 819 formed therein, is defined via masking and the surrounding areas etched away to the top of waveguide 816. At step 1016, the outline of waveguide 816 is defined via masking and the surrounding areas etched away to the top of waveguide 814. At step 1018, an outline of waveguide 814 is defined via masking and the surrounding areas etched away to the top of substrate 112. At step 1020 contacts are formed on detector 820 and amplifying waveguide 816.

The inventors have empirically concluded that an amplifier photo-detection PIC 810 as described above is operable.

Figure 11:
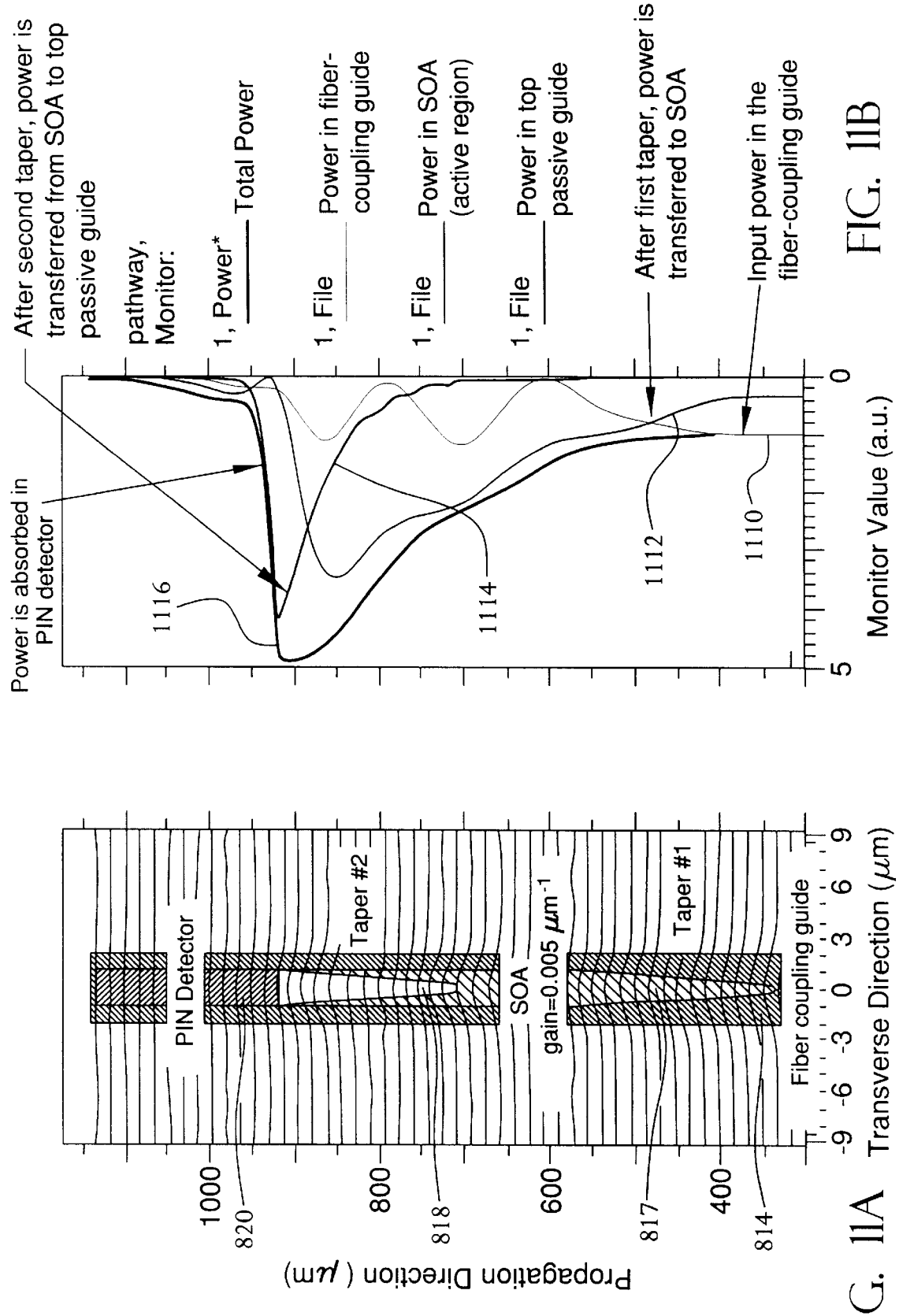
FIG. 11 provides a graphical representation of the optical power in various portions of an amplifier photo-detection device in accordance with the invention as a function of time.

FIG. 11 provides a graphical representation of the optical power along the length of amplifier photo-detection device 810 for light injected into coupling waveguide 814. On the left side of FIG. 11 a top view of the amplified photo-detector 810 is shown. Coupling waveguide 814, lateral tapers 817 and 819, and detector 820 are illustrated. As optical power propagates through device 810, the various components experience varying levels of power.

The corresponding graph shown on the right side of FIG. 11 illustrates the power experienced at the different sections of detector PIC 810 as a function of time. Line 1110 represents the power experienced by coupling waveguide 814. Line 1112 represents the power experienced in amplifying waveguide 816. Line 1114 represents the power experienced in waveguide 1116. Line 1116 represents the total power in the system.

Optical power entering device 810 initially encounters coupling waveguide 814. Accordingly, line 1110, which represents the power in waveguide 814, initially has a non-zero value. As an optical signal propagates in device 810, it experiences taper 817 of waveguide 816, wherein the power is coupled into waveguide 816. Accordingly, line 1112, which represents the power in waveguide 816, begins to rise at the location of taper 817. Line 1112 continues to rise across the length of waveguide 816 illustrating the amplifying characteristics of waveguide 816. An optical signal propagating in device 810 next encounters taper 819, wherein the power is coupled into waveguide 818. Accordingly, line 1116, which represents the power in waveguide 818, begins to rise at the location of taper 819. Finally, optical power propagating all the way through device 810 is absorbed into detector 820. Accordingly, at the location corresponding to the beginning of detector 820, power in all portions of device, as indicated by lines 1110, 1112, 1114, and 1116, quickly falls off.

Thus, an asymmetric amplifier photo-detector in accordance with an aspect of the invention is operable to amplify optical power prior to absorption by a photo-detector. The amplification of the optical signal prior to detection improves receiver responsivity. This is especially important for signals having higher bit rates where thermal noise of the electrical amplifier dominates the detector sensitivity.

Figure 12:
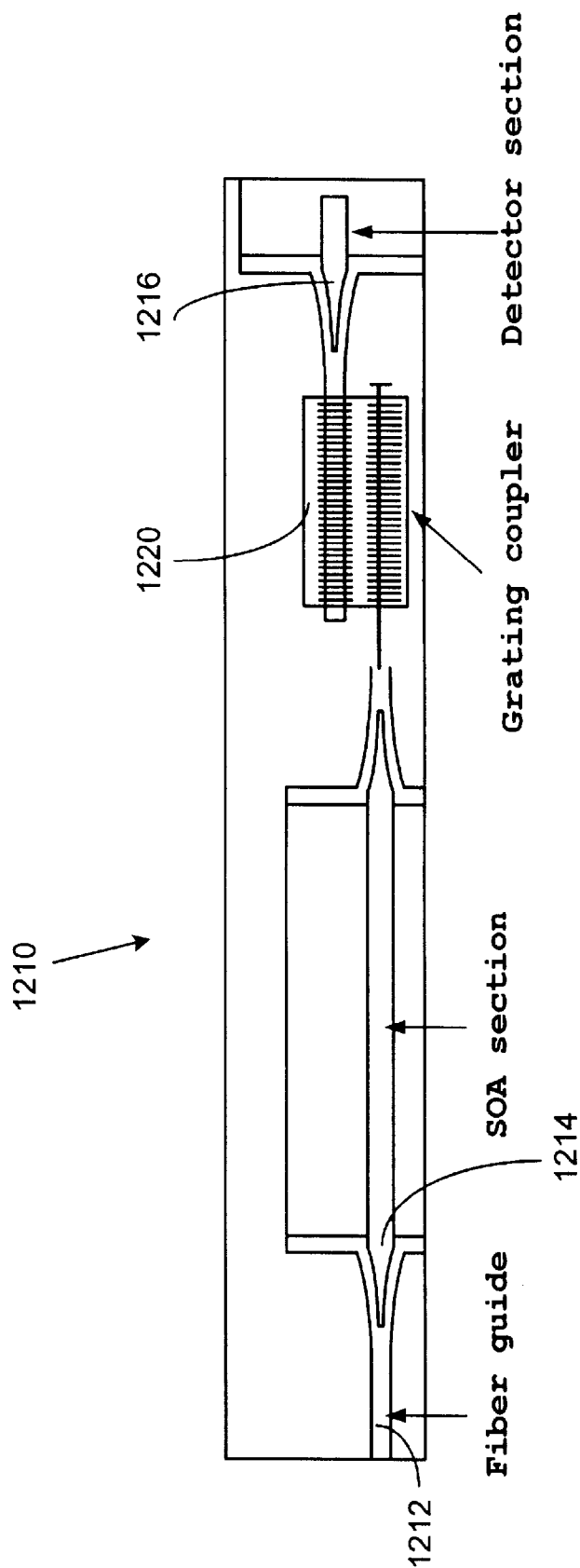
FIG. 12 is a top view of an amplifier photo-detector in accordance with the invention incorporating a filter.

It is known that amplified spontaneous emission (ASE) can interfere with the responsivity of a receiver. Accordingly, it may be desirable to incorporate a filter into a photo-detector device to reduce ASE. FIG. 12 provides a top plan view of a detector device in accordance with the invention that incorporates an ASE filter. As shown, device 1210 comprises a coupling waveguide 1212, a second waveguide 1214 having an optical amplifier therein, and a third waveguide 1216 with a detector 1218 coupled thereto. Device 1210 further comprises a grating filter 1220 positioned between second waveguide 1214 and third waveguide 1216. As described in detail in an article by Alferness et al., entitled "Grating-Assisted InGaAsP/InP Vertical Codirectional Coupler Filter", 55 Applied Physics Letters at 2011–13 (November, 1989), the contents of which are hereby incorporated by reference in their entirety, a grating filter operates to eliminate ASE and the shot noise induced by the ASE which could interfere with the responsivity of the receiver. The light exiting waveguide 1214 is filtered by grating filter 1220 prior to entering waveguide 1216. In the exemplary embodiment of FIG. 12, grating filter 1220 is a parallel coupler grating wherein the grating filter operates across two parallel waveguides. In an alternative embodiment, grating filter 1220 may be a straight-on grating, without the parallel coupler. It should be noted that grating filter 1220 might also be tunable, allowing for the selective filtering of wavelengths. In such an embodiment, grating filter 1220 can be modulated, or tuned to allow a specific wavelength of light to be incident on the detector section coupled to waveguide 1216.

Figure 13:
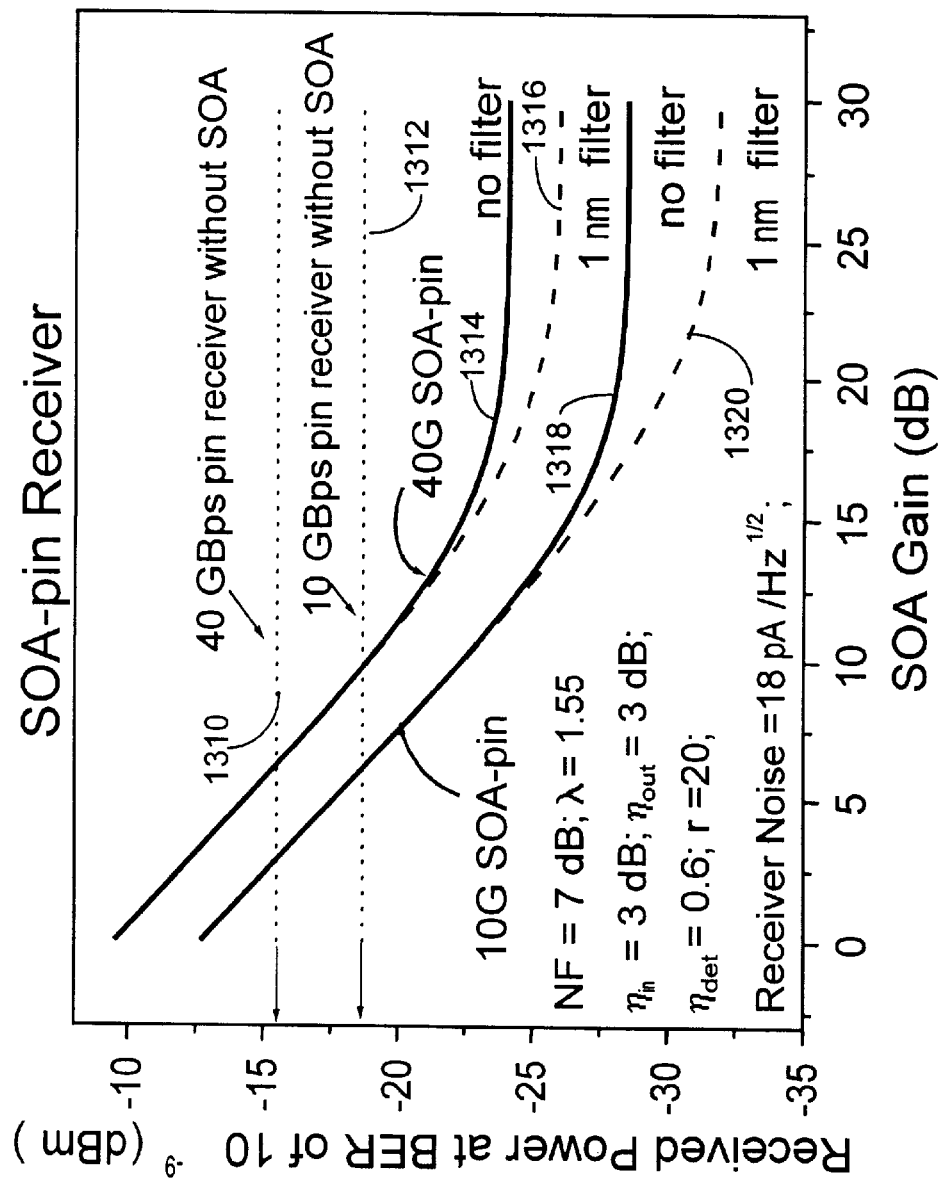
FIG. 13 is a graph of the calculated minimum input power (in dBm) to achieve a bit-error rate of $10^{-9}$ as a function of amplifier gain.

FIG. 13 illustrates the improvement in receiver responsivity resulting from amplification such as that provided by an amplifier photo-detector in accordance with the invention. FIG. 13 is a graph of the calculated minimum input power (in dBm) that can be detected at the photo-detector in order to obtain a bit-error rate of $10^{-9}$ as a function of amplifier or SOA gain. Dotted line 1310 represent the minimum input power that can be detected in 40 GBps detector, which does not have an amplifier therein, in order to achieve a bit-error rate of $10^{-9}$. Similarly, dotted line 1312 represent the minimum power that can be detected in a 10 GBps detector, which also does not have an amplifier therein, in order to achieve a bit-error rate of $10^{-9}$. Because lines 1310 and 1312 represent photo-detectors without an amplifier element, the lines are horizontal.

By comparison, line 1314, which represents the minimum input power that can be detected in order to obtain a bit error rate of $10^{-9}$ in a 40 gigabit amplifier detector, falls off quickly as amplification increases. Dotted line 1316 represents the minimum input power that can be detected for a 40 gigabit amplifier detector having a filter therein. Line 1318 represents the minimum input power that can be detected in order to obtain a bit error rate of $10^{-9}$ in a 10 gigabit amplifier detector. Dotted line 1320 represents the input power that can be detected for a 10 gigabit amplifier detector having a filter therein.

As illustrated by lines 1314 and 1318, the minimum input power that can be detected to achieve a bit error rate of $10^{-9}$ decreases as the amplifier gain in the amplifier photo-detector increases. When the gain increases to beyond about 15 dB, the input power needed to achieve the desired bit error rate begins to level off. Comparing line 1310, which corresponds to a 40 GBps detector without an amplifier, and line 1314, which corresponds to a 40 GBps detector with an amplifier, it can be seen that where the gain in the detector exceeds about 15 dB, the amount of input power that can be received at the detector in order to obtain the desired bit error rate is reduced by approximately 10 dB. Thus, a significant increase in detector responsivity is achieved through the use of pre-amplification. Furthermore, as illustrated by lines 1316 and 1318, adding a filter to reduce ASE results in an even more responsive amplifier detector where the amplifier gain is above about 15 dB. However, it should be noted that for higher baud rate detectors such as, for example, the 40 gigabit detector represented by lines 1314 and 1316, the filter does not improve responsivity as greatly as for lower baud rate receivers such as, for example, the 10 gigabit detector represented by lines 1318 and 1320.

Thus, there have been disclosed improved monolithic integrated photo-detector devices and improved PIC device designs. According to an aspect of the invention, an asymmetric waveguide based photo-detector PIC is provided. The exemplary embodiment of the improved photo-detector PIC is highly responsive and is operable for use at frequencies at least as high as 40 GHz.

There has further been disclosed a design for incorporating more than two vertically coupled asymmetric waveguides having lateral tapers in a single PIC device. For example, according to an aspect of the invention, there has been disclosed an amplifier optical-detector PIC. The PIC improves upon existing asymmetric detector designs by amplifying signals prior to detection. The amplified signal provides for greater accuracy of detection by diminishing inaccuracies introduced by noise in the electronic detection circuit.

The amplifier optical-detector PIC is an example of the integration of multiple asymmetric waveguides and multiple device types, i.e. passive waveguides, amplifiers, and detectors, in a single PIC. The multiple asymmetric waveguide design can be applied to form other types of devices. In devices incorporating the present invention, passive waveguides may be used for efficient coupling to fibers and to form various passive devices such as, for example, couplers, splitter, Mach Zehnder interferometers, and arrayed waveguide (AWG) routers. In the same devices, optical amplifiers may be used to provide optical pre-amplification or to compensate for losses associated with communicating with PICs containing other passive components. Finally, these same devices may incorporate detectors, perhaps operating in an array of detectors, wherein each is capable of high-speed, low-noise, high dynamic range operation up to and beyond 40 GHz. Thus, the inventors have created a multiple asymmetric waveguide design that may be used to provide the types of complex PICs that to this point have not been realized.

While the invention has been described and illustrated with reference to specific embodiments, those skilled in the art will recognize that modification and variations may be made without departing from the principles of the invention as described above and set forth in the following claims. For example, an integrated optical detector in accordance with the invention may comprise a taper having different measurements than those described. Also, the waveguides may be composed of materials different than those mentioned above such as, for example, GaAs, GaSb, and GaN, and may have thicknesses other than those described. Furthermore, the invention may be employed in a wide variety of devices. For example, an integrated amplifier optical-detector in accordance with the invention may be employed to make high sensitivity 40 GHz receivers for optical communication links. Accordingly, reference should be made to the appended claims as indicating the scope of the invention.

What is claimed is:

1. A device for operating on an optical signal comprising:
   a first waveguide for guiding primarily a first mode of light;
   a second waveguide for guiding primarily a second mode of light, said second waveguide positioned vertically relative to said first waveguide, wherein said second waveguide has a lateral taper formed therein for guiding said first mode of light between said first waveguide and said second waveguide and wherein said first mode of light has an effective index of refraction different from that of said second mode of light; and
   a photo-detector for detecting light propagating in said second waveguide, said photo-detector positioned vertically relative to said second waveguide and being separated from said first waveguide by said second waveguide.

2. The device of claim 1, wherein said second mode of light has an effective index of refraction greater than that of said first mode.

3. The device of claim 1, wherein said lateral taper is about 1 $\mu$m wide at a first point and is between about 1.8 and 2.2 $\mu$m wide at a second point, and the length of the taper between said first point and said second point is between about 250 and 400 $\mu$m.

4. The device of claim 1, wherein said lateral taper is between about 250 and 400 $\mu$m in length, said lateral taper has a tapered end with a width of about 1 $\mu$m, and said lateral taper is at least between about 1.8 and 2.2 $\mu$m in width at a point along the length of said lateral taper.

5. The device of claim 1, wherein said lateral taper has a taper angle of between about 0.05 and 0.09 degrees.

6. The device of claim 1, wherein said first mode of light has an effective index of refraction of between about 3.173 and 3.177 and said second mode of light has an effective index of refraction between about 3.2 and 3.22.

7. The device of claim 1, wherein said lateral taper is an adiabatic taper.

8. The device of claim 1, wherein said first waveguide has an input coupling loss from a cleaved or lensed fiber of less than 2 dB.

9. The device of claim 1, wherein said first waveguide has a far-field pattern angle of between about 13 degrees and 18 degrees in a vertical direction and a horizontal direction.

10. The device of claim 1, wherein said second waveguide has a coupling loss with said first waveguide of less than 1 dB and has an absorption coefficient with said photo-detector of greater than 80% across 30 $\mu$m of the photo-detector.

11. The device of claim 1, wherein said second waveguide further comprises a reflector for reflecting light propagating in said second waveguide causing the light to propagate under said detector a second time.

12. The device of claim 11, wherein said reflector comprises a metal coating.

13. The device of claim 11, wherein said reflector comprises a dielectric stack.

14. The device of claim 1 wherein the photo-detector is a PIN device.

15. The device of claim 14, wherein said PIN device comprises an $In_{0.53}Ga_{0.47}As$ absorption layer.

16. A device for operating on an optical signal comprising:
   a first waveguide for guiding primarily a first mode of light;
   a second waveguide for guiding primarily a second mode of light, said second waveguide positioned vertically relative to said first waveguide, wherein said second waveguide has a lateral taper formed therein for guiding said first mode of light between said first waveguide and said second waveguide and wherein said first mode of light has an effective index of refraction different from that of said second mode of light; and
   at least one further waveguide for guiding primarily a third mode of light, said further waveguide positioned vertically relative to said second waveguide and separated from said first waveguide by said second waveguide, wherein said further waveguide has a lateral taper formed therein for guiding said second mode of light between said second waveguide and said further waveguide and wherein said third mode of light has an effective index of refraction different from that of said second mode of light.

17. The device of claim 1, wherein said second mode of light has an effective index of refraction greater than that of said first mode.

18. The device of claim 17, wherein said third mode of light has an effective index of refraction greater than that of said second mode.

19. The device of claim 16 wherein said lateral taper in said further waveguide is positioned substantially adjacent to said taper in said second waveguide.

20. The device of claim 16, wherein said further waveguide comprises a photodetector.

21. The device of claim 16, further comprising a photodetector for detecting light propagating in said further waveguide, said photo-detector positioned vertically relative to said further waveguide and being separated from said second waveguide by said further waveguide.

22. The device of claim 21, wherein said second waveguide comprises an optical amplifier.

23. The device of claim 16, wherein at least one of said first waveguide, said second waveguide, and said further waveguide is employed to form an active photonic device.

24. The device of claim 23, wherein at least one of said first waveguide, said second waveguide, and said further waveguide is employed to form a passive photonic device.

25. A detector for operating on an optical signal comprising:
   a first waveguide for guiding primarily a first mode of light;
   a second waveguide for guiding primarily a second mode of light, said second waveguide positioned vertically relative to said first waveguide, wherein said second waveguide has a lateral taper formed therein for guiding said first mode of light between said first waveguide and said second waveguide and wherein said first mode of light has an effective index of refraction different from that of said second mode of light;
   at least one further waveguide for guiding primarily a third mode of light, said further waveguide positioned vertically relative to said second waveguide and separated from said first waveguide by said second waveguide, wherein said further waveguide has a lateral taper formed therein for guiding said second mode of light between said second waveguide and said further waveguide and wherein said third mode of light has an effective index of refraction different from that of said second mode of light; and
   a photo-detector for detecting light propagating in said further waveguide, said photo-detector positioned vertically relative to said further waveguide and being separated from said second waveguide by said further waveguide.

26. The detector of claim 25, wherein said second waveguide comprises an optical amplifier.

27. The detector of claim 25, wherein said photodetector is a PIN device.

28. A device for operating on an optical signal comprising:
   a first waveguide for guiding primarily a first mode of light;
   a second waveguide for guiding primarily a second mode of light, said second waveguide positioned vertically relative to said first waveguide, wherein said second waveguide has a lateral taper formed therein for guiding said first mode of light between said first waveguide and said second waveguide and wherein said first mode of light has an effective index of refraction different from that of said second mode of light, and said second waveguide comprises an optical amplifier for amplifying the optical signal;
   at least one further waveguide for guiding primarily a third mode of light, said further waveguide positioned vertically relative to said second waveguide and separated from said first waveguide by said second waveguide, wherein said further waveguide has a lateral taper formed therein for guiding said second mode of light between said second waveguide and said further waveguide and wherein said third mode of light has an effective index of refraction different from that of said second mode of light; and
   a photo-detector for detecting light propagating in said further waveguide, said photo-detector positioned vertically relative to said further waveguide and being separated from said second waveguide by said further waveguide.

29. The device of claim 28, wherein said second mode of light has an effective index of refraction greater than that of said first mode.

30. The device of claim 29, wherein said third mode of light has an effective index of refraction greater than that of said second mode.

31. The detector of claim 30, wherein said first mode of light has an effective index of refraction in said first waveguide of about 3.2, said second mode of light has an effective index of refraction in said second waveguide of about 3.32, and said third mode of light has an effective index of refraction in said further waveguide of about 3.37.

32. The device of claim 28, wherein said first waveguide has an input coupling loss from a cleaved or lensed fiber of less than about 2 dB.

33. The device of claim 28, wherein said first waveguide has a far-field pattern angle of between about 13 degrees and 18 degrees in a vertical direction and a horizontal direction.

34. The device of claim 28, wherein said further waveguide has a coupling loss with said second waveguide of less than 1 dB and has an absorption coefficient with said photo-detector of greater than 80% across 30 $\mu$m of the photo-detector.

35. The device of claim 28, wherein said further waveguide further comprises a reflector for reflecting light propagating in said second waveguide causing the light to propagate under said detector a second time.

36. The device of claim 28, wherein said second waveguide provides gain of up to about 20 db to said second mode of light.

37. The device of claim 28, further comprising a grating filter for filtering said second mode of light to remove amplified spontaneous emission prior to said second mode of light being coupled into said further waveguide.

38. The device of claim 37, wherein said grating filter is a parallel coupler grating filter.

39. The device of claim 37, wherein said grating filter is a straight grating filter.

40. The device of claim 37, wherein said grating filter is tunable to allow a specific wavelength of light to be incident on said further waveguide.

* * * * *